United States Patent [19]
Jackson et al.

[11] Patent Number: 5,553,766
[45] Date of Patent: Sep. 10, 1996

[54] IN-SITU DEVICE REMOVAL FOR MULTI-CHIP MODULES

[75] Inventors: Raymond A. Jackson, Poughkeepsie; Kathleen A. Lidestri, Hopewell Junction; David C. Linnell, Poughkeepsie; Raj N. Master, Wappingers Falls, all of N.Y.

[73] Assignee: International Business Machines Corporation, Armonk, N.Y.

[21] Appl. No.: 342,563

[22] Filed: Nov. 21, 1994

[51] Int. Cl.⁶ .............................. H05K 3/34; B23K 3/00
[52] U.S. Cl. .............. 228/13; 228/264; 228/119
[58] Field of Search .................... 228/119, 191, 228/264, 13, 19, 103

[56] References Cited

U.S. PATENT DOCUMENTS

| | | | |
|---|---|---|---|
| 4,586,252 | 5/1986 | Faticanti | 228/56.1 |
| 4,767,047 | 8/1988 | Todd et al. | 228/56.5 |
| 4,894,910 | 1/1990 | Reimer et al. | 228/264 |
| 4,962,878 | 10/1990 | Kent | 228/55 |
| 5,058,856 | 10/1991 | Gordon et al. | 251/11 |
| 5,198,066 | 3/1993 | Cederström | 228/235.1 |

FOREIGN PATENT DOCUMENTS

| | | | |
|---|---|---|---|
| 104289 | 8/1979 | Japan | 228/264 |
| 114221 | 5/1988 | Japan | 228/264 |

OTHER PUBLICATIONS

IBM Technical Disclosure Bulletin, "Memory Wire Chip Removal Fixture", No. 10A, Mar. 1990, p. 195.

IBM Technical Disclosure Bulletin, "Interposer Remove Tool", vol. 35, No. 4A, Sep. 1992, pp. 25–27.

IBM Technical Disclosure Bulletin, vol. 16, No. 9, Feb. 1974, R. Noth et al, "Multilayer Substrate Repair Method", pp. 2789–2790.

IBM Technical Disclosure Bulletin, vol. 29, No. 12, May 1987, G. Galyon et al, "Chip With Lengthened Solder Joints Using Shape Memory Alloy", pp. 5213–5214.

IBM Technical Disclosure Bulletin, vol. 33, No. 10A, Mar. 1991, K. Ledestri et al., "Bimetal Component Removal", pp. 43–44.

*Primary Examiner*—Samuel M. Heinrich
*Attorney, Agent, or Firm*—Whitman, Curtis, Whitman & McGinn; Susan M. Murray

[57] ABSTRACT

Deformation of a lifting ring of bimetallic structure or memory metal is matched to a solder softening or melting temperature to apply forces to lift a chip from a supporting structure, such as a substrate or multi-chip module, only when the solder connections between the chip and the supporting structure are softened or melted. The temperature of the chip, module and solder connections there between is achieved in a commercially available box oven or belt furnace or the like and results in much reduced internal chip temperatures and thermal gradients within the chip as compared to known hot chip removal processes. Tensile and/or shear forces at solder connections and chip and substrate contacts are much reduced in comparison with known cold chip removal processes. Accordingly, the process is repeatable at will without significant damage to or alteration of electrical characteristics of the chip or substrate.

20 Claims, 3 Drawing Sheets

IN-SITU DEVICE REMOVAL FOR MULTI-CHIP MODULES

BACKGROUND OF THE INVENTION

1. Field of the Invention

The present invention generally relates to the manufacture and repair of multi-chip modular electronic devices and, more particularly, to apparatus for removing one or more chips from a multi-chip module without damage to the chip or module substrate and at lowest possible temperatures of the chip and module.

2. Description of the Prior Art

The demand for higher logic circuit and digital signal processor speed and complexity has required the development of packaging techniques and structures which can form extremely complex interconnections between a plurality of integrated circuit chips which are, themselves, often highly complex devices. In particular, a module formed of layers of ceramic or polymer material having conductive patterns thereon and conductor-filled holes or vias formed therein for making layer-to-layer connections has become well-known. In such a module, the layers are stacked with high accuracy of registration and fused or sintered to form a unitary structure on which a plurality of chips may be mounted. The number of chips which are interconnected in such a modular package can often number well in excess of one hundred.

Clearly, in such complex devices, many possibilities are presented for the production of minor defects. At the present state of the art, it is considered most cost-effective to test such modules at various stages of manufacture and to repair or provide alternative connections at any point where testing reveals any portion of the device to be functionally questionable or marginal. For example, where a wiring connection may be found to have an increased resistance or a reduced resistance path to another portion of the circuit, the design of the module is made such that virtually any portion of the wiring can be disconnected and an alternative connection made. Such a repair, referred to as an engineering change (EC), results in a high manufacturing yield of devices which are of high reliability and highly uniform functionality.

Of course, the functionality of any such module depends, in large part, on the functionality of the integrated circuit chips mounted thereon. The chip need not be defective, itself, to engender marginal functionality since effects such as parasitic capacitances and capacitive coupling of portions of the chip either to itself or other portions of the module when the chip is mounted thereon can alter propagation time through circuits on the chip. Random variation in such propagation times may make certain individual chips incompatible with other individual chips when installed in a particular module. For that reason, it is sometimes necessary to remove a chip from a module for replacement. It is also often necessary to remove a chip from a module to complete a diagnostic analysis of a module in which some aspect of functionality is questionable.

Therefore, it is not unusual for a particular chip or a plurality of chips to be removed from a module and either replaced or reinstalled a relatively large number of times during the manufacture of a module. Since the chips are generally attached to the module by solder connections (generally made by melting solder bumps, known as C4's, which are connection pads already on the chip to connection pads on the module by heating the entire assembly) which provide both electrical connections and mechanical support, removal of one or more or even all of the chips from a module is essentially a desoldering operation involving the application of heat, mechanical separation of the chip and module and removing molten solder from the joint. This process is costly and time-consuming and may subject the chip and/or the module to temperatures which can cause degradation of or damage to either or both.

For example, the current method of choice, prior to the present invention, for chip removal involves application of heat by focussing an infra-red beam from a lamp source through an aperture onto the back of the chip to heat the chip and the solder connections. The semiconductor material in the chip (e.g. silicon) is relatively transparent to such long wave length light and heating of the solder connections proceeds fairly rapidly. However, doped regions of the semiconductor chip are less transparent and are thus differentially heated both by impingement of the infra-red energy and by radiation and conduction from the solder connections, particularly since such doped regions are generally formed closer to the connection side of the chip. Further, metal connections are not transparent but reflective and have high thermal conductivity. Metal connections are also usually connected to highly doped regions of semiconductor material. Therefore, due to several of these mechanisms, substantial temperature gradients may be caused within the semiconductor chip.

Since doped semiconductor regions are also diffusion sources for impurities when temperatures are raised above 350° C. and are, at the same time, subject to being heated to a greater degree than the remainder of the chip, it can be readily appreciated that the chip, itself, is subjected to potentially damaging conditions in order to produce a temperature of 330° C. (a typical solder melting point) at the solder connections. In fact, temperatures often in excess of 450° C. are caused within the chip in order to perform the desoldering operation and are substantially uncontrollable and unpredictable within a chip. Process sensitivity is very high since the likelihood of damage to the chips increases dramatically above 450° C.

A temperature of 450° C. is sufficient to cause some degree of annealing of the metal in the chip and consequent changes in dimension and other physical properties of both the metal and semiconductor materials. Further, substantial temperature gradients may mechanically damage the semiconductor and/or insulator structures therein at such temperatures particularly due to localized stresses from differential thermal expansion. Accordingly, manufacturing yield may be reduced due to damage to or change of performance characteristics of the chips (including difficulties in diagnostics caused by inconsistency of performance of particular chips) and time and cost required for repair of modules is increased.

Additionally, it should be noted that removal of large chips using current or projected technologies cannot be done by this infra-red focussing process. Further, since these processes are highly automated and chips of various sizes must be accommodated for each module design, the "hot" chip removal technique described above is particularly capital intensive; which increased costs must usually be amortized over smaller production runs of a particular design.

Several so-called "cold" chip removal processes are also known and widely practiced; generally for low-end products using relatively mature technologies. These techniques include such techniques as tensile pull, torque removal and ultrasonic chip removal. However, since these techniques at least rely on either a "brute force" mechanical action or subject the chips to high acceleration loading, damage to the chip, particularly the bottom layer metallurgy (BLM) and/or module is relatively common. These "cold" chip removal techniques also do not provide for removal of excess solder.

Accordingly, a need exists in which the desoldering operation for chip removal may be done at low cost, high reliability and without criticality or difficulty of control and maintenance of process conditions and in which temperature and mechanical forces applied to the chips and/or the module can be easily limited to levels far below those involved in previously known processes.

SUMMARY OF THE INVENTION

It is therefore an object of the present invention to provide a low-temperature, inexpensive and reliable chip removal technique, including both apparatus and method, of low process sensitivity and in which mechanical forces applied to the chip and module are minimized.

It is another object of the invention to provide a chip removal apparatus and method which is highly repeatable with little likelihood of alteration of performance of individual chips over numerous repetitions.

It is a further object of the invention to provide a chip removal apparatus and method primarily using standard, commercially available semiconductor processing apparatus and requiring little, if any, custom fabrication of tools.

In order to accomplish these and other objects of the invention, an apparatus is provided for removing a semiconductor chip from a substrate including, in combination, a chip lifting assembly, and an arrangement for supporting the chip lifting assembly above a substrate to which at least one chip is attached by solder, wherein the chip lifting assembly comprises a gripper or spider for gripping a chip and an arrangement for applying a lifting force to the gripper or spider only at a temperature equal to or exceeding a softening temperature of solder.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
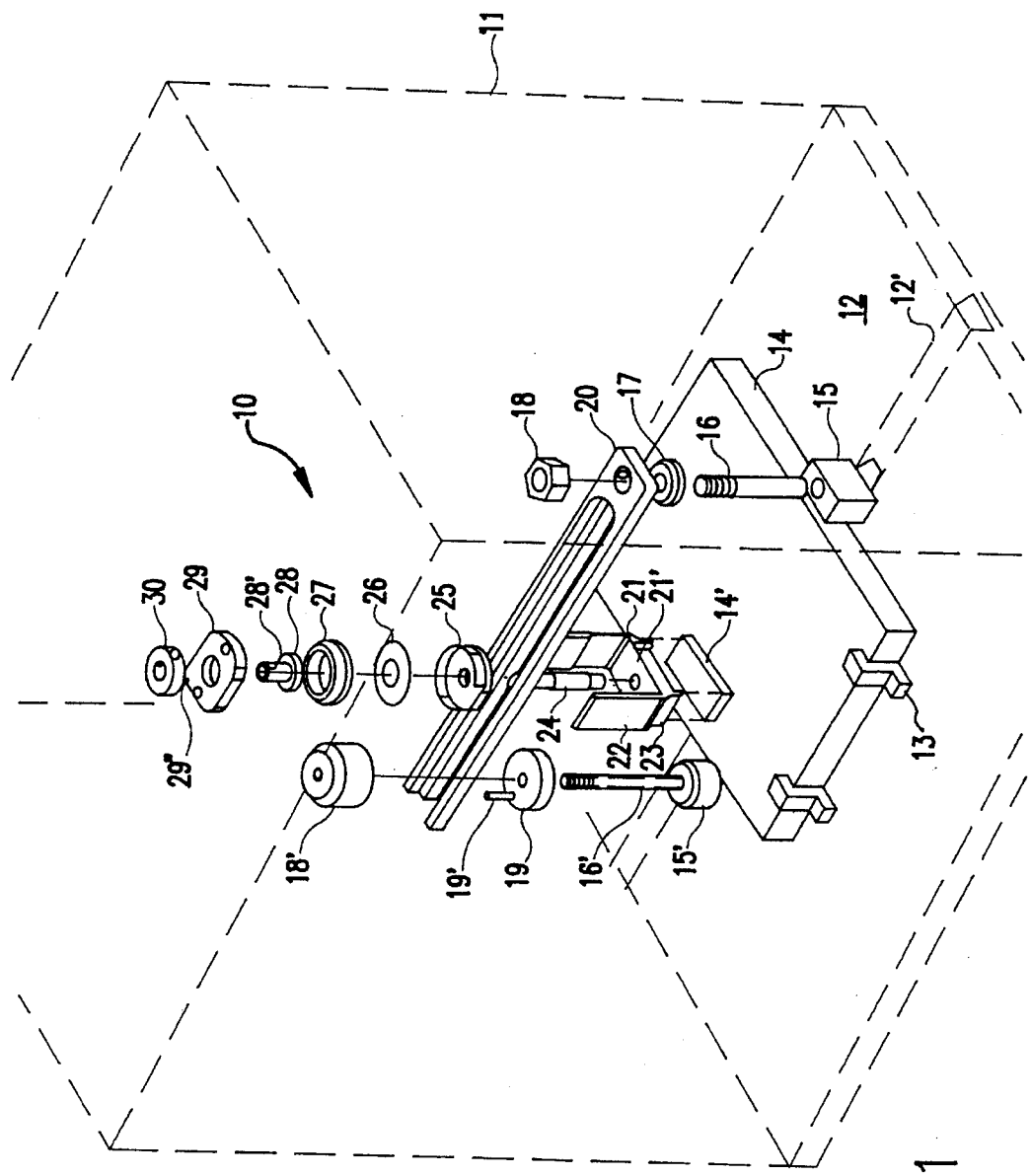
FIG. 1 is an exploded view of the chip removal apparatus in accordance with the invention.

Referring now to the drawings, and more particularly to FIG. 1, there is shown, in an exploded view, the overall apparatus 10 for performing chip removal in accordance with the principles of the invention. It is to be understood that a distinctive feature of the invention is that the chip removal operation is performed in a belt furnace or box oven of conventional design (schematically indicated by dashed lines 11); details of which are not otherwise important to the practice of the invention. It is well-understood that the internal temperatures of these types of enclosures can be closely regulated and the temperature of materials placed therein or passed therethrough can be closely limited. The box oven or belt furnace can be fitted with a base-plate 12 of low thermal expansion material such as titanium having two or more channels (e.g. tapered "dove-tail" channel 12') formed therein for mounting any desired number of the apparatus in accordance with the invention. However, it is preferred for economy to simply use the same fixture which was used for attachment of chips to the module. The latter alternative is of much the same form as the base-plate shown and additionally provides for retention of pins on the module during heating for removal of one or more chips from the module in accordance with the invention.

The location of the chip lifting apparatus 10 in accordance with the invention is preferably fixed at a single point by attaching a mounting block 15 to channel 12', allowing the remainder of the structure to pivot about that point. However, the structure by which the apparatus is fixed in position and stabilized is not critical to the practice of the invention. One or more circuit modules 14 are preferably held down to the base-plate 12 by a bracket or other arrangement such as is shown at 13. In the alternative, the module can be held from the lower side thereof such as by gripping of pins or other connection or mounting structure protruding therefrom and, of course, would not be visible in the view of FIG. 1. These hold-down arrangements can also be attached to channels such as 12' or other arrangements such as a vacuum hold-down can be used.

In accordance with a preferred embodiment of the invention, a support post 16 is fitted to mounting block 15, preferably with a threaded attachment to provide height adjustment. The upper end of support post 16 is preferably threaded to receive an internally threaded collar 17 to support a preferably slotted jig such as beam 20 at a fixed distance above base-plate 12 from which one or more chip lifting assemblies may be supported. Beam 20 is preferably secured to support post 16 with a nut 18.

The opposite end of beam 20 is supported in a generally similar manner except that block 15' is preferably not attached to base-plate 12 but simply bears against it, allowing the beam 20 to be freely positioned. Support post 16' is similar to support post 16 but some arrangement such as a threaded coupling or a spring loaded pawl for retaining block 15' attached to the lower end thereof is preferably provided. Internally threaded collar 19 is generally similar to collar 17 except that it is considered preferable to provide an upstanding protrusion such as cam 19' for locking collar 19 against beam 20 to prevent rotation and change of height above base-plate 12 during positioning. Alternatively, cam 19' can engage a matching aperture in the lower surface of knob 18' to provide a fine adjustment of the height of support collar 19 above surface 12 to match the height of support collar 17. In either case, it is a relatively simple procedure to obtain an adequately parallel relationship between beam 20 and base-plate 12.

The above-described structure is thus seen to provide a freely positionable yet stable support for beam 20 which is of a length to span the electronic module 14 from which removal of one or more chips is desired. To perform this removal operation, at least one further chip lifting assembly is supported by or suspended from jig or beam 20 as will now be described. It is to be appreciated that this further assembly can be scaled to any convenient size and is preferably similar in transverse dimensions to the chip to be removed. Therefore, as many similar assemblies as desired or required to concurrently remove any number of chips positioned below beam 20 can be supported by a single beam. Likewise, a plurality of beams, each supporting one or more such further assemblies can be provided to carry out concurrent chip removal of a plurality of chips in a single heating operation.

A gripper member 21 or spider is preferably formed from titanium for dimensional stability with temperature and also for its comparative resilience. Spider 21 is preferably formed in a generally H-shaped configuration having a horizontal connecting portion 21' between two generally parallel vertical portions. The short, lower parts of the generally parallel portions of the spider 21 form jaws 23 which are spaced from each other by a transverse dimension of the chip to be removed. Chips are generally of standard sizes and only a relatively few such spiders 21 are sufficient to accommodate most chips. Of course, spiders with custom jaw spacing may be readily fabricated if desired or needed for particular custom chips.

Figure 2:
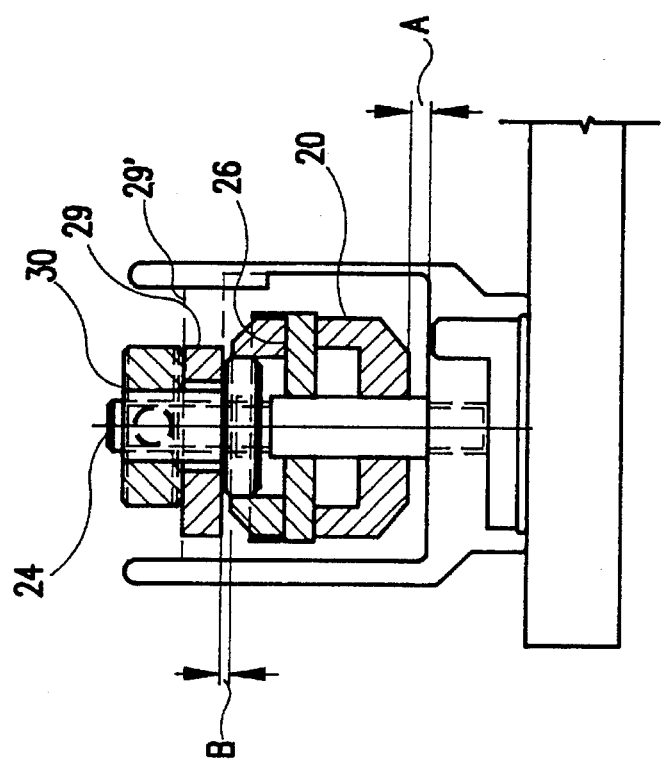

The lower ends of jaws 23 are preferably formed with a recess and an inwardly turned flange to bear against opposing sides or ends of the chip. The upper sides of the recess are arranged to bear on the upper side of the chip while avoiding direct contact with the chip at the upper corner thereof since that portion of the chip is extremely fragile and subject to breakage. At the same time, as shown in FIG. 2, the portion of the recess bearing on the upper side of the chip prevents the inwardly curving flange from coming in contact with the substrate or module surface where delicate conductor patterns could be easily damaged.

The elongated upstanding upper parts 22 of the vertical portions of the spider form handles which may be squeezed slightly toward each other which slightly flexes the spider 21 at the ends or across horizontal portion 21' to slightly spread jaws 23 to grip a chip firmly across a transverse dimension thereof when the upper parts 22 are released. The dimensions and stiffness of portions of the spider are preferably determined to limit the compressional force applied to the chip in a manner well-understood in the art. For example, to limit the compressional force applied to the chip, the horizontal portion 21' of spider or gripper 21 may be formed with a region of reduced thickness such as a notch, as shown, to increase flexibility thereof.

A threaded aperture is preferably provided centrally of the horizontal portion 21' of spider 21 in order to receive the lower end of a puller shaft 24. This arrangement has the added function that when tension is applied to puller shaft 24 from such a location, the horizontal portion 21' of the spider 21 tends to flex slightly and thus slightly increase the gripping force of jaws 23 on chip 14'. Again, the compressional gripping force on the chip can be limited by notching of horizontal portion 21' and further regulated by cam 29 as will be discussed below.

The upper end of the puller shaft 24 engages an assembly which, in accordance with an important principle of operation of the present invention, provides a pulling force to separate the chip 14' from module 14 at an appropriate temperature or time during heating, as will be described below. The assembly, itself, includes a cup-shaped carrier disc 25 which preferably has thin, upstanding edges to locate puller disc 26 and to guide lifter disc 27 while allowing relative axial movement thereof, as seen by comparison of FIGS. 2 and 3.

Puller disc 26 is preferably formed of a layered bimetallic material, the layers of which have different thermal expansion coefficients. Thus the disc, while substantially flat at room temperatures, as shown in FIG. 2, ideally takes on a spherical shape (but, in practice, more usually a saddle-shaped form) as shown in section in FIG. 3 at a predetermined temperature which preferably coincides with the softening or melting temperature of the solder used to mount the chip 14' to the module 14 (e.g. in the range of 300° C.–350° C.). A similar effect can be achieved through fabrication of puller disc 26 from a "shape memory alloy", sometimes referred to as a memory metal such as Nitenol (generic to nickel-titanium shape memory alloys) including Tinel (trademark), available from Raychem Corp. of 300 Constitution Drive, Menlo Park, Calif. 94025. As is known, such memory metal materials can be worked into a particular shape from an original shape but will resume the original shape at a particular temperature in a highly repeatable manner.

It should also be noted that the puller disk 26 may be made to curve either upwardly, as illustrated, or downwardly, depending on the orientation of puller disk 26 as the invention is assembled. While these alternatives are substantially arbitrary, it is preferred, in practice, to use two oppositely oriented puller disks 26. When this is done, substantially the same geometry will bear against each of lifting ring 27 and the carrier disk and is believed to provide a more axial pulling force through puller shaft 24.

Affixed to the upper end of puller shaft 24 is a height locator fitting 28 which may have an upstanding sleeve 28' formed integrally therewith. Whether the sleeve 28' is provided integrally with fitting 28 or separately, sleeve 28' is preferably provided to serve as a bearing for cam 29. It is preferred that sleeve 28' and fitting 28 be integrally formed for convenience of locking of parts to puller shaft 24 with set screws.

Figure 3:
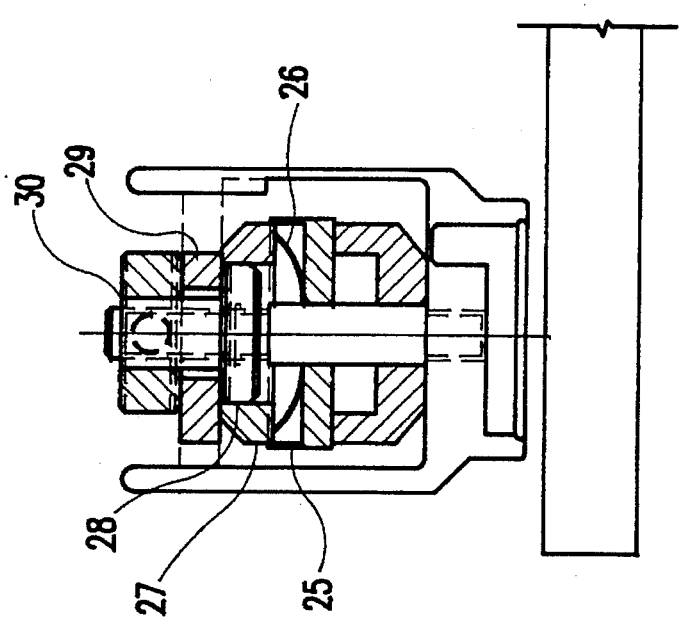
FIGS. 2 and 3 show operation of the invention using a bimetallic or memory metal disc in sectional view.

Cam 29 is provided to exert outward pressure between the upwardly extending portions 22 of gripper 24 to provide a uniform and repeatable gripping force on chip 14' when cam 29 is turned, as indicated by dashed lines 29'. This gripping force can be regulated or limited by providing a region of reduced thickness on one or both upstanding arms 22, as shown in FIGS. 2 and 3. A protrusion 29" is preferably provided on cam 29 to prevent over-rotation of the cam 29 and to increase positional stability thereof during operation of the invention. The cam surfaces can also be shaped to provide a slight "over-center" locking action to enhance positional stability during operation.

Cam 29 is retained on shaft 24 and sleeve 28' by a height knob 30. Once adjustments are made to obtain clearances for control of operation of the invention as will be discussed below, height knob 30 is preferably locked to puller shaft 24 by means of two set screws, one of which bears against sleeve 28 and the other of which bears directly against puller shaft 24 through an aperture in sleeve 28'. Thus, it should be noted that all lost motion between cam 29 and puller shaft 24 can be taken up and avoided so that operation of the invention does not cause motion of the cam 29 against the upstanding portions 22 or gripper 21; avoiding vibration (e.g. frictionally generated noise) or alteration of gripping force during the chip removal process.

As shown in FIG. 2, when the assembly including parts 21–30 is applied to a chip, a preferred limit of motion of gripper 24 is established by clearance A (at room temperature) between gripper 24 and beam 20. This dimension is essentially arbitrary but preferably about 0.060 inches to exceed the distance molten solder will span due to surface tension effects. This dimension is established by fine adjustment of the fittings (e.g. 17, 18, 18' and 19) affixed to the upper ends of shafts 16 and 16' which support beam 20. Alternatively, shafts 16, 16' can be rotated to achieve such fine adjustment. Height adjustment fitting 28 is also located to achieve an essentially arbitrary clearance B (also at room temperature) between the upper surface of lifter disk 27. This latter clearance is to compensate for curving of the bimetallic or memory metal puller disk 26 at temperatures below the softening or melting temperature of the solder and is preferably about 0.015 inches. This clearance also has the effect of providing a sharp onset of tension during heating.

Thus, again comparing FIGS. 2 and 3, once the apparatus in accordance with the invention has been assembled to a chip to be removed by first placing the gripper 24 on the chip and positioning beam 20 at an appropriate clearance above it and then assembling the remainder of parts as described above, the entire assembly (including the module and chip) is heated. As temperature increases, the clearance B between lifter ring 27 and cam 29 is first taken up by lifter disc 26 at temperatures below the softening or melting point of the solder. As temperature further increases, the bimetallic or memory metal lifter disk 26 exerts force on the bottom of lifter ring 27 and, through cam 29 and height knob 30, places tension on puller shaft 24 to lift gripper 21 and the chip 14 only when the solder is at least softened at that temperature. As temperature is further increased, lifting motion is limited by the taking up of the clearance A between gripper 21 and beam 20, as shown in the final position illustrated in FIG. 3. The contact between gripper 21 and beam 20 also stabilizes this position and prevents further contact between the chip 14' and the module 14, as might occur due to rotation of shaft 24 (e.g. perpendicular to its axis) in the slot formed in beam 20.

In accordance with the invention, application of tension to the solder connections between chip 14' and module 14 can be avoided until a temperature is reached at which the solder will soften or melt. Therefore, application of stresses to the connection pads of the chip 14' and module 14 can be substantially avoided and damage thereto is prevented. At the same time, due to the use of a box oven or belt furnace which can be closely regulated in temperature to only slightly (e.g. 10° C.) above the melting point of the solder (e.g. 330° C.) and the omission of additional radiant energy to cause heating in the chip which is conducted through the chip to the connections, internal temperatures of the chip may be kept below temperatures at which significant diffusion can take place. Large temperature gradients and resultant stresses within the chip are also effectively avoided.

It can also be appreciated that while the use of a flat bimetallic puller disk 26 is sufficient to the successful practice of the invention, a rapid onset of tension on the solder connections is desirable when the softening or melting point of the solder is reached in order to optimally limit tension applied to the connection pads of the chip 14' and module 14. The use of a memory metal is especially useful to achieve this purpose since the onset of change of shape is more sharp as temperature increases than with a plain bimetallic structure used as lifting ring 26, even in combination with clearance B. However, the memory metal requires reworking, albeit minor and easily accomplished, prior to reuse.

Figure 4:
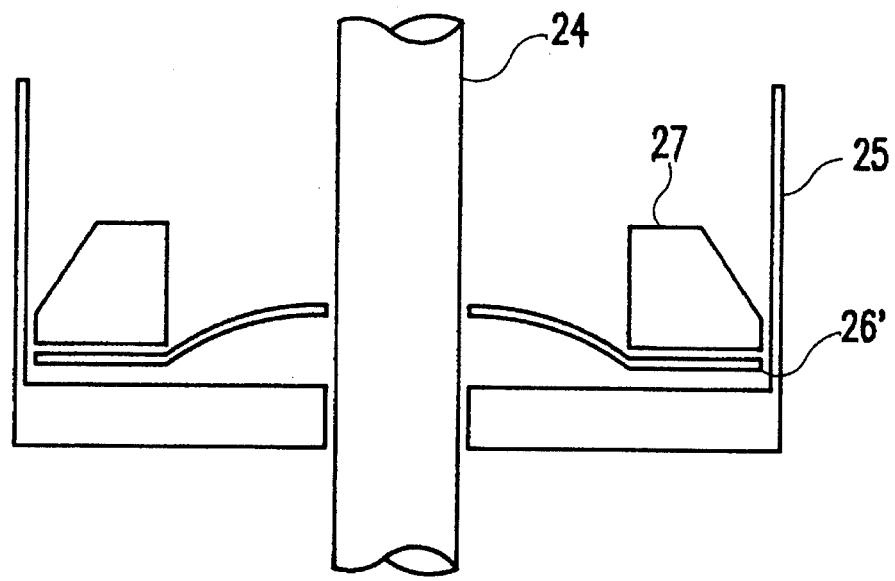
FIGS. 4 and 5 show operation of the invention using a snap bimetallic disk.
Figure 5:
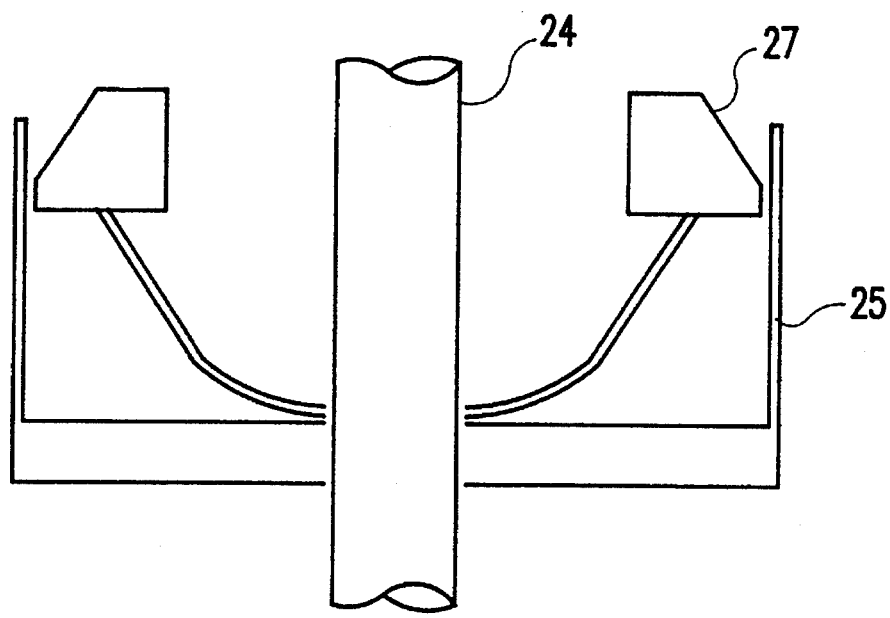

In accordance with a further embodiment of the invention, a particularly sharp response upon reaching a temperature threshold can be a achieved without the necessity of reworking puller disk 26 through use of a snap bimetallic puller disk 26' as shown in FIGS. 4 and 5. A snap bimetallic is similar to the flat bimetallic puller disk 26 except that the central portion thereof is formed with a shallow dimple with the material having the lower thermal expansion coefficient overlaying the outside of the dimple at low temperature.

As the temperature of the snap bimetallic puller disc 26' increases, the outer layer is placed in tension while the inner layer is placed in compression. When these opposing forces become sufficiently great, they are relieved by the spherical dimple turning inside-out so that the layer of the bimetallic having the greater thermal expansion coefficient forms the outside of the dimple. The angular bend (in section) at the edge of the dimple will be slightly accentuated and rotated to form a generally conical flange which is also accentuated by the elevated temperature. Thus, movement in excess of twice the height of the dimple (but preferably limited by clearance A) can be achieved suddenly and with very high repeatability at a particular temperature and yet the original shape will be resumed when the snap bimetallic puller disc 26' is cooled. Thus the onset of the pulling operation can be made particularly sharp without the need for reworking the puller disk as would be required using a memory metal.

In view of the foregoing, it is seen that an apparatus and methodology is provided by the invention which accomplishes chip removal from a supporting structure, such as a multi-chip module, inexpensively and reliably at a much reduced chip temperature well below the temperature where significant amounts of dopant diffusion would occur. The method and apparatus are of low process sensitivity and apply forces to the chip only when a temperature is reached at which the solder connections are softened or melted. The apparatus may be employed and the process carried out in a standard, commercially available box oven or belt furnace and no additional selective heating, such as with an infra-red beam is required. As a result, likelihood of damage to the chip or the supporting structure or alteration of device characteristics is extremely low even when a chip is removed a large number of times.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. Apparatus for removing a semiconductor chip from a substrate including, in combination:

a chip lifting assembly; and means for supporting said chip lifting assembly above a substrate to which at least one chip is attached by means of solder, wherein said chip lifting assembly comprises:

means for gripping a chip; and means for applying a lifting force to said means for gripping a chip only at a temperature equal to or exceeding a softening temperature of said solder, wherein said means for supporting said at least one chip lifting assembly comprises a slotted jig.

2. Apparatus as recited in claim 1, wherein said means for applying a lifting force includes an element which deforms with temperature.

3. Apparatus as recited in claim 2, wherein said means for applying a lifting force includes a bimetallic element.

4. Apparatus as recited in claim 2, wherein said means for applying a lifting force includes a memory metal element.

5. Apparatus as recited in claim 2, wherein said means for applying a lifting force includes a snap bimetallic element.

6. Apparatus as recited in claim 1, further including:

means for controllably raising a temperature of said chip, said substrate and said chip lifting assembly.

7. Apparatus as recited in claim 6, wherein said means for controllably raising a temperature includes a box oven.

8. Apparatus as recited in claim 6, wherein said means for controllably raising a temperature includes a belt furnace.

9. Apparatus for removing a semiconductor chip from a substrate including, in combination:

a chip lifting assembly; and means for supporting said chip lifting assembly above a substrate to which at least one chip is attached by means of solder, wherein said chip lifting assembly comprises:

means for gripping a chip; and means for applying a lifting force to said means for gripping a chip only at a temperature equal to or exceeding a softening temperature of said solder, wherein said means for supporting said at least one chip lifting assembly comprises a beam, wherein said beam is a slotted beam.

10. Apparatus for removing a semiconductor chip from a substrate including, in combination:

a chip lifting assembly; and means for supporting said chip lifting assembly above a substrate to which at least one chip is attached by means of solder, wherein said chip lifting assembly comprises:

means for gripping a chip; and means for applying a lifting force to said means for gripping a chip only at a temperature equal to or exceeding a softening temperature of said solder, wherein said means for gripping a chip comprises a member including at least two generally parallel portions connected by a connection portion, wherein said at least two generally parallel portions form opposing jaws, wherein said at least two generally parallel portions include handle portions for controlling said opposing jaws, said apparatus further including means for applying a force between said handle portions.

11. Apparatus as recited in claim 10, wherein said means for applying a force includes a cam positioned between said handle means.

12. Apparatus as recited in claim 10, wherein said means for applying a lifting force includes an element which deforms with temperature.

13. Apparatus as recited in claim 12, wherein said means for applying a lifting force includes a bimetallic element.

14. Apparatus as recited in claim 12, wherein said means for applying a lifting force includes a memory metal element.

15. Apparatus as recited in claim 12, wherein said means for applying a lifting force includes a snap bimetallic element.

16. Apparatus as recited in claim 10, further including:

means for controllably raising a temperature of said chip, said substrate and said chip lifting assembly.

17. Apparatus as recited in claim 16, wherein said means for controllably raising a temperature includes a box oven.

18. Apparatus as recited in claim 16, wherein said means for controllably raising a temperature includes a belt furnace.

19. Apparatus as recited in claim 10, wherein said opposing jaws are each formed with a recess and a flange extending generally toward another of said opposing jaws.

20. Apparatus for removing a semiconductor chip from a substrate including, in combination:

a chip lifting assembly; and means for supporting said chip lifting assembly above a substrate to which at least one chip is attached by means of solder, wherein said chip lifting assembly comprises:

means for gripping a chip; and means for applying a lifting force to said means for gripping a chip only at a temperature equal to or exceeding a softening temperature of said solder, wherein said means for gripping a chip comprises a member including at least two generally parallel portions connected by a connection portion, wherein at least one of said connecting portion and one of said generally parallel portions includes means for regulating gripping force applied to said chip, wherein said means for regulating gripping force includes a region of reduced thickness.

* * * * *